(12) United States Patent
Eilbeck et al.

(10) Patent No.: US 6,391,514 B1
(45) Date of Patent: May 21, 2002

(54) MIXED SOLVENT SYSTEM FOR POSITIVE PHOTORESISTS

(75) Inventors: J. Neville Eilbeck, Hillesden (GB); Alberto D. Dioses, Bridgewater, NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/642,128

(22) Filed: Aug. 18, 2000

Related U.S. Application Data

(63) Continuation of application No. 09/172,051, filed on Oct. 14, 1998.

(51) Int. Cl.[7] .............................. G03F 7/023; G03F 7/30
(52) U.S. Cl. ...................... 430/191; 430/192; 430/193; 430/326
(58) Field of Search ............................ 430/270.1, 168, 430/191, 192, 193

(56) References Cited

U.S. PATENT DOCUMENTS

| | | | |
|---|---|---|---|
| 5,196,289 A | * 3/1993 | Jeffries, III et al. | ........ 430/192 |
| 5,221,592 A | * 6/1993 | Khanna et al. | .............. 430/165 |
| 5,702,862 A | 12/1997 | Ohno et al. | .................. 430/191 |
| 6,225,020 B1 | * 5/2001 | Jung et al. | ................ 430/270.1 |

FOREIGN PATENT DOCUMENTS

| | | |
|---|---|---|
| EP | 0 510 671 A | 10/1992 |
| WO | WO 98 27462 A | 6/1998 |

* cited by examiner

*Primary Examiner*—John S. Chu
(74) *Attorney, Agent, or Firm*—Andrew F. Sayko, Jr.; Krishna G. Banerjee

(57) ABSTRACT

A photosensitive positive working composition suitable for use as a photoresist, which comprises an admixture of at least one film forming resin; at least one photosensitizer; and a photoresist solvent mixture containing more than 50 weight percent of an alkylene glycol alkyl ether and less than 50 weight percent of either an alkyl alkoxy propionate or an alkyl amyl ketone, and a process for producing such a photoresist composition.

19 Claims, No Drawings

MIXED SOLVENT SYSTEM FOR POSITIVE PHOTORESISTS

This application is a continuation of Ser. No. 09/172,051, filed Oct. 14, 1998.

BACKGROUND OF THE INVENTION

The present invention relates to a process for preparing radiation sensitive positive photoresist compositions and particularly such compositions containing film forming resins, such as novolak resins or vinyl phenol resins together with a photosensitizer component, such as a diazonaphthoquinone or a photo-acid generator, such as a diaryliodonium salt or an aryl onium salt. It is well known in the art to produce positive photoresist formulations, such as those described in U.S. Pat. No. 3,666,473, 4,115,128 and 4,173,470. These include alkali soluble phenolformaldehyde novolak resins and vinyl phenol resins, together with light sensitive components (photosensitizers), usually a substituted diazonaphthoquinone compound or a photo-acid generator. The resin and photosensitizer are dissolved in an organic solvent, or mixture of solvents, and are applied as a thin film or coating to a substrate suitable for the particular application desired.

The film forming resin component of these photoresist formulations is normally soluble in an alkaline aqueous solution and insoluble in water, but the photosensitizer, which may be a separate component or be a component of the film forming resin (i.e. the film forming resin may contain both a film forming component and a photosensitive component), acts as a dissolution rate inhibitor with respect to the resin component. Upon exposure of selected areas of the coated substrate to actinic radiation, however, the photosensitizer undergoes a radiation induced structural transformation, and for a positive photoresist, the exposed areas of the coating are rendered more soluble than the unexposed areas. This difference in solubility rates causes the exposed areas of the positive photoresist coating to be dissolved when the substrate is immersed in an alkaline developing solution while the unexposed areas are largely unaffected, thus producing a positive relief pattern on the substrate.

In many instances, the exposed and developed substrate will also be subjected to treatment by a substrate etchant solution or gas plasma. The photoresist coating protects the coated areas of the substrate from the etchant and thus the etchant is only able to etch the uncoated areas of the substrate which, in the case of a positive photoresist, correspond to the areas that were exposed to actinic radiation. Thus, an etched pattern can be created on the substrate that corresponds to the pattern of the mask, stencil, template, etc. that was used to create selective exposure patterns on the coated substrate prior to development.

The relief pattern of photoresist on the substrate produced by the method described above is useful for various applications including, for example, as an exposure mask or a pattern such as is employed in the manufacture of miniaturized integrated electronic components. The properties of a photoresist composition that are important in commercial practice include the photospeed of the photoresist, photoresist resolution and depth of focus.

Good photospeed is important for a photoresist, particularly in applications where a number of exposures are needed, for example, in generating multiple patterns by a repeated process, or where light of reduced intensity is employed, such as in projection exposure techniques where the light is passed through a series of lenses and monochromatic filters. Thus, a fast photospeed is particularly important for a photoresist composition employed in processes where a number of multiple exposures must be made to produce a mask or series of circuit patterns on a substrate. These optimum conditions include a constant development temperature and time in a particular development mode, and a developer system selected to provide complete development of exposed photoresist areas while maintaining a maximum unexposed photoresist film thickness loss not exceeding about 10 percent of initial thickness.

Another important requirement for a photoresist is that the walls of the profiles produced on the substrate should be straight and as close to vertical as possible (i.e. good image edge acuity). Better profiles provide more precise images on the substrate.

Photoresist resolution refers to the capability of a photoresist system to reproduce the smallest equally spaced line pairs and intervening spaces of a mask which is utilized during exposure, with a high degree (greater than 80 degrees) of image edge acuity in the developed exposed spaces. In many industrial applications, particularly in the manufacture of miniaturized electronic components, a photoresist is required to provide a high degree of resolution for very small line and space widths (on the order of 0.5 micron [micrometer] or less). Depth of focus refers to the range of the defocus settings where the given feature size can be replicated.

The ability of a photoresist to reproduce very small dimensions of 0.5 micron (micrometer) or less is extremely important in the production of large-scale integrated circuits on advanced silicon chips and similar components. Circuit density on such a chip can only be increased, assuming photolithographic techniques are utilized, by increasing the resolution capabilities of the photoresist. Although negative photoresists, wherein the exposed areas of photoresist coating become insoluble and the unexposed areas are dissolved away by the developer, have been extensively used for this purpose by the semiconductor industry, positive photoresists have inherently higher resolution and are frequently utilized as replacements for the negative photoresists.

A problem with the use of conventional positive photoresists in the production of miniaturized integrated circuit components is that the positive photoresists generally have slower photospeed than their negative analogs. Various attempts have been made in the prior art to improve the photospeed, resolution and depth of focus of positive photoresist compositions. For example, in U.S. Pat. No. 3,666,473, a mixture of two phenol formaldehyde novolak resins was used together with a typical sensitizer, the novolak resins being defined by their solubility rates in alkaline solutions of a particular pH and by their cloud points. In U.S. Pat. No. 4,115,128, a third component consisting of an organic acid cyclic anhydride was added to the phenolic resin and naphthoquinone diazide sensitizer to provide increased photospeed.

SUMMARY OF THE INVENTION

The present invention provides a process for producing a positive working photoresist composition utilizing a novel solvent system. It has been found that such a photoresist can be formulated when the film forming resin (normally alkali soluble and water insoluble) and the photosensitizer component are blended with a photoresist solvent mixture containing more than 50 weight percent of a $C_1$–$C_4$ alkylene glycol $C_1$–$C_4$ alkyl ether (AGAE), such as propylene glycol methyl ether (PGME) and either a $C_1$–$C_4$ alkyl amyl ketone (MK), such as an MAK (methyl amyl ketone, also known as 2-heptanone), or a $C_1$–$C_4$ alkyl (e.g. ethyl) $C_1$–$C_4$ alkoxy (e.g. ethoxy) propionate (MP), such as an ethyl-3-ethoxy propionate (EEP). Such photoresist compositions provide very good resolution with substantially straight wall profiles.

European Pat. No. 106774 discloses the use of a propylene glycol alkyl ether alone, as a photoresist solvent. U.S. Pat. No. 5,360,696 teaches the use of a $C_1$–$C_4$ alkyl amyl ketone alone as a solvent for positive photoresists. U.S. Pat. No. 5,336,583 discloses a photoresist solvent that is a mixture of a lower alkyl propionate and an alkyl amyl ketone. Japanese Published Pat. Application 10-10711 (Jan. 16, 1998) discloses the use of a photoresist solvent mixture of methyl amyl ketone and PGME, wherein the PGME is from 3 to 28 weight percent of the solvent composition. It is also disclosed that increasing the amount of PGME, e.g. to 30 percent, yields a photoresist composition that is not acceptable. European Pat. No. 211667 discloses the use of $C_1$–$C_4$ alkyl $C_1$–$C_4$ alkyloxy propionates as solvents for positive photoresists.

The present invention relates to a photoresist composition utilizing a solvent system that results from combining two solvents of the present invention wherein the AGAE is the major component, i.e. more than 50 weight percent of the total photoresist solvent, preferably at least 60 percent, more preferably at least 70 percent and most preferably at least 80 percent. The combined solvent system of the present invention provides a photoresist composition having excellent photosensitivity and photospeed (Dose To Clear and Dose To Print), resolution (with very good wall profiles) and depth of focus.

The present invention also relates to a positive working photoresist composition, which composition consists essentially of an admixture of at least one film forming resin, such as a novolak resin or a vinyl phenol resin; at least one photosensitizer component, such an orthodiazonaphthoquinone photosensitizer or a photo-acid generator; and a photoresist solvent mixture containing a major amount (greater than 50% by weight) of a $C_1$–$C_4$ alkylene glycol $C_1$–$C_4$ alkyl ether, such as a propylene glycol methyl ether (PGME), and less than 50% by weight of either a $C_1$–$C_4$ alkyl amyl ketone, such as a methyl amyl ketone or a $C_1$–$C_4$ alkyl $C_1$–$C_4$ alkoxy propionate; such as an ethyl-3-ethoxy propionate.

The claimed invention also relates to a process for producing such a positive working photoresist composition having good photospeed, excellent resolution with substantially straight (greater than 80 degrees acuity) wall profiles, which process consists essentially of forming an admixture of at least one film forming resin, that is normally an alkali soluble, water insoluble resin, such as a novolak resin or a vinyl phenol resin; at least one photosensitizer component, such as an orthodiazonaphthoquinone photosensitizer or a photo-acid generator; and a photoresist solvent mixture containing a major amount (more than 50 weight percent) of a $C_1$–$C_4$ alkylene glycol $C_1$–$C_4$ alkyl ether and a minor amount (less than 50 weight percent) of either a $C_1$–$C_4$ alkyl amyl ketone or a $C_1$–$C_4$ alkyl $C_1$–$C_4$ alkoxy propionate.

DETAILED DESCRIPTION OF THE PREFERRED EMBODIMENTS

The production of film forming, normally water insoluble and alkali soluble, novolak resins, which may be used for preparing photoresist compositions, is well known in the art. A procedure for their manufacture is described in Chemistry and Application of Phenolic Resins, Knop A. and Scheib, W.; Springer Verlag, N.Y., 1979 in Chapter 4 which is incorporated herein by reference. Paravinyl phenols and polyvinyl phenols are described in U.S. Pat. Nos. 3,869,292 and 4,439,516, which are incorporated herein by reference. The production of film forming vinyl phenol resins, such as a hydroxystyrene derivative, is described in U.S. Pat. Nos. 4,868,256.

Similarly, the use of o-diazonaphthoquinones is well known to the skilled artisan, as demonstrated by Light Sensitive Systems, Kosar, J.; John Wiley & Sons, N.Y., 1965 in Chapter 7.4, which is also incorporated herein by reference. These sensitizers which comprise a component of the process of the present invention are preferably substituted diazonaphthoquinone sensitizers, which are conventionally used in the art in positive photoresist formulations. Such sensitizing compounds are disclosed, for example, in U.S. Pat. Nos. 2,797,213, 3,106,465, 3,148,983, 3,130,047, 3,201,329, 3,785,825 and 3,802,885. Useful photosensitizers include, but are not limited to, the sulfonic acid esters made by condensing phenolic compounds such as a hydroxy benzophenone with a naphthoquinone-(1,2)-diazide-5-sulfonyl chloride or a naphthoquinone-(1,2)-diazide4-sulfonyl chloride. The sensitizer which comprises a component of the photoresist composition of the present invention may be an ester of a multihydroxy phenolic or alcoholic compound, such as a trishydroxyphenylethane (THPE) or a hydroxybenzophenone, and a sulfonic acid or sulfonic acid derivative such as a sulfonyl chloride, such as described in U.S. Pat. Nos. 3,106,465 and 4,719,167. Such a sensitizer preferably has its hydroxy groups partially esterified by reacting from about 30 to about 100 percent of the hydroxy groups with one or more organic acid group containing compounds. The organic acid group containing compounds are preferably organic acid chlorides such as sulfonyl chlorides including 4-chloro benzene sulfonyl chloride, 4-methane sulfonyl chloride, para-toluene sulfonyl chloride, trifluoromethane sulfonyl chloride, 1,2-naphthoquinone diazide4-sulfonyl chloride (F-sulfonyl chloride), 1,2-naphthoquinone diazide-5-sulfonyl chloride (L-sulfonyl chloride); acetyl chloride or benzoyl chloride.

In the preferred embodiment, the solid parts of the photoresist composition, the film forming resin and the photosensitive component, preferably range from 15% to about 99% resin and from about 1% to about 85% photosensitizer. A more preferred range of resin would be from about 50% to about 90% and most preferably from about 65% to about 85% by weight of the solids photoresist components. A more preferred range of the photosensitizer would be from about 10% to about 50% and most preferably from about 15% to about 35%, by weight of the solids in the photoresist. In manufacturing the photoresist composition, the resin and the photosensitizer are mixed with the solvent mixture of the present invention, such that the solvent mixture is present in an amount of from about 40% to about 90% by weight of the overall photoresist composition. A more preferred range is from about 60% to about 83% and most preferably from about 65% to about 70% by weight of the overall photoresist composition. Further, the preferred amount of alkylene glycol alkyl ether (AGAE) in the solvent mixture is from greater than 50% to about 90%. The preferred solvent ratio of AGAE/AAK or AAP in the solvent mixture is from about 90%/10% to about 60%/40%, even more preferably from about 90%/10% to about 70%/30% and most preferably from about 85%/15% to about 75%/25%.

Additives such as colorants, dyes, anti-striation agents, plasticizers, adhesion promoters, coating aids, speed enhancers and surfactants may be added to the solution of novolak resin, sensitizer and solvent system before the solution is coated onto a substrate.

Examples of dye additives that may be used together with the photoresist compositions of the present invention may include, but are not limited to, Methyl Violet 2B (C.I. No. 42535), Crystal Violet (C.I. 42555), Malachite Green (C.I. No. 42000), Victoria Blue B (C.I. No. 045) and Neutral Red (C.I. No. 50040) at one to ten percent weight levels, based upon the combined weight of novolak and sensitizer. The dye additives help provide increased resolution by inhibiting back scattering of light from the substrate surface.

Anti-striation agents may be used up to 5 percent weight level based upon the combined weight of novolak and sensitizer.

Plasticizers which may be used include, for example, phosphoric acid tri-(beta-chloroethyl)-ester, stearic acid, dicamphor, polypropylene, acetal resins, phenoxy resins or alkyl resins at one to ten percent weight levels based upon the combined weight of novolak and sensitizer. The plasticizer additives are added to improve the coating properties of the material and enable the application of a film that is smooth and of uniform thickness to the substrate.

Adhesion promoters which may be used include, for example, beta-(3,4-epoxy-cyclohexyl)-ethyltrimethoxysilane or gamma-aminopropyl triethoxysilane up to a 4 percent weight level based upon the combined weight of novolak resin and sensitizer.

Speed enhancers that may be used include, for example, picric acid, nicotinic acid or nitrocinnamic acid at a weight level of up to 20 percent based upon the combined weight of novolak and sensitizer. These enhancers tend to increase the solubility of the photoresist coating in both the exposed and unexposed areas and, thus they are used in applications when speed of development is the overriding consideration even though some degree of contrast may be sacrificed; i.e. while exposed areas of the photoresist coating will be dissolved more quickly by the developer, the speed enhancers will also cause a larger loss of photoresist from the unexposed areas as well.

Additional photoresist solvents may be added in minor amounts to the photoresist solvent mixtures of the present invention, but comprise less than 10% by weight of the photoresists solvent. Preferably no such additional solvents are employed in the solvent mixtures of the present invention.

Non-ionic surfactants that may be used include, for example, nonylphenoxy poly(ethyleneoxy) ethanol, octylphenoxy (ethyleneoxy) ethanol, and dinonyl phenoxy poly(ethyleneoxy)ethanol at up to 10 percent weight levels based upon the combined weight of the novolak and sensitizer.

The prepared photoresist solution can be applied to a substrate by any conventional method used in the photoresist art including dipping, spraying, whirling and spin coating. When spin coating, for example, the photoresist solution can be adjusted as to the percentage of solids content in order to provide coating of the desired thickness given the type of spinning equipment utilized and the amount of time allowed for the spinning process. Suitable substrates include silicon, aluminum, or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide coated wafers such as are utilized in the production of microprocessors and other miniaturized integrated circuit components. An aluminum/aluminum oxide wafer can be used as well. The substrate may also be comprised of various polymers such as polyesters.

After the photoresist composition is coated onto the substrate, the substrate may be heated at about 20° C. to 110° C. This temperature treatment is selected in order to reduce and control the concentration of residual solvents in the photoresist through evaporation while not causing substantial thermal degradation of the photosensitizer. In general, one desires to minimize the concentration of solvents and thus this temperature treatment is conducted until a substantial amount of the solvents has evaporated and a thin coating of photoresist composition, on the order of one micron (micrometer) in thickness, remains on the substrate. This treatment is normally conducted at temperatures in the range of from about 20° C. to about 110° C. In a preferred embodiment the temperature is conducted at from about 50° C. to about 110° C. A more preferred range is from about 80° C. to about 110° C. This treatment is conducted until the rate of change of solvent removal becomes relatively insignificant. The temperature and time selection depends upon the photoresist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. In a convection oven, evaporation may take from 15 minutes to 1 hour or more. The coating is rendered non-tacky and it is within the contemplation of this invention that the dried coating contains residual solvent in an amount of from about 1–30%, preferably 5–20% and most preferably 8–12% based upon the weight of the dried coating. The coated substrate can then be exposed to actinic radiation especially ultraviolet radiation in any desired exposure pattern produced by use of usable negatives, positive masks, stencils, templates, etc. in a manner well known to the skilled artisan.

The exposed photoresist-coated substrates may next be developed such as by etching or by being subjected to (e.g. immersed in) a developer, such as an aqueous alkaline developing solution. The solution is preferably agitated, for example, by nitrogen burst agitation. Suitable developers non-exclusively include water solutions containing an alkali hydroxide, ammonium hydroxide or tetramethyl ammonium hydroxide. However, any other suitable developer known to the skilled artisan may be employed. The substrates are allowed to remain in the developer until all, or substantially all, of the photoresist coating has been removed from the exposed areas.

After removal of the coated wafers from the developing solution, a post-development heat treatment or bake may be used to increase the coating adhesion and chemical photo-resistance to etching solutions and other substances. The post-development heat treatment can comprise oven baking of the coating and substrate below the coating's softening point. This post exposure baking or heat treatment may be conducted at from about 95° C. to about 160° C., preferably 95° C. to 150° C. and more preferably 112° C. to 120° C. This heat treatment may be conducted with a hot plate system for from about 10 seconds to the time necessary to crosslink the resin. This normally ranges from 10 seconds to 90 seconds, more preferably from about 30 seconds to about 90 seconds and most preferably from 15 to 45 seconds. Durations for longer than 90 seconds are possible but do not generally provide any additional benefit. Longer times are required for convection oven baking. The time selected depends on the choice of composition components and the substrate used. In industrial applications, particularly in the manufacture of microcircuitry units on silicon/silicon dioxide-type substrates, the developed substrates may be treated with a buffered hydrofluoric acid/base etching solution or gas plasma. The photoresist compositions of the present invention are photoresistant to acid/base etching solutions and gas plasma etching and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all percentages and parts are by weight, and all molecular weights are weight average molecular weight.

EXAMPLE 1

A formulation was prepared by preparing ten batches of the following mixture of novolak resin, photosensitive component and coating aid:

| | |
|---|---|
| Novolak resin (1) | 2.500 gm. |
| Photoactive compound (2) | 0.687 gm. |
| Coating aid (3) | 0.070 gm. |

(1) The Novolak resin of Example 1 was a phenol formaldehyde copolymer made by condensing a 5:4:2 mixture of p-cresol:m-cresol:2,3,5-trimethyl phenol (cresol mixture) with formaldehyde at a mole ratio of 0.7 parts total cresol mixture to 1.0 part of formaldehyde using an oxalic acid catalyst. The resultant polymer had a dissolution rate of 578 mJ/cm.$^2$.

(2) The photoactive compound of Example 1 was an NK-240 proprietary 3,3'-Bis-(2-hydroxy-5-methylbenzyl)-4,4'-hydroxy-5,5'-bismethyldiphenylmethane photosensitizer available from Nippon Zeon Co.

(3) The coating aid of Example 1 was FC-430 surfactant (Fluoroaliphatic polymeric ester, available from 3M—as a 2 weight percent solution in PGME).

EXAMPLES 2, 3, 4, 5, 6, 7, 8, 9, 10 and 11

To each of the ten batches of Example 1 were added, respectively:

| | | |
|---|---|---|
| Example 2 | PGME (90%) | 10.181 gm. |
| | EEP (10%) | 1.131 gm. |
| Example 3 | PGME (85%) | 9.612 gm. |
| | EEP (15%) | 1.696 gm. |
| Example 4 | PGME (80%) | 9.047 gm. |
| | EEP (20%) | 2.269 gm. |
| Example 5 | PGME (75%) | 8.491 gm. |
| | EEP (25%) | 2.831 gm. |
| Example 6 | PGME (70%) | 7.915 gm. |
| | EEP (30%) | 3.390 gm. |
| Example 7 | PGME (90%) | 10.186 gm. |
| | MAK (10%) | 1.138 gm. |

-continued

| | | |
|---|---|---|
| Example 8 | PGME (85%) | 9.696 gm. |
| | MAK (15%) | 1.699 gm. |
| Example 9 | PGME (80%) | 9.047 gm. |
| | MAK (20%) | 2.268 gm. |
| Example 10 | PGME (75%) | 8.483 gm. |
| | MAK (25%) | 2.839 gm. |
| Example 11 | PGME (70%) | 7.919 gm. |
| | MAK (30%) | 3.413 gm. |

EXAMPLE 12

The photoresist formulations of Examples 2 to 11 were each spin coated onto a silicon wafer, with the spin speeds adjusted to provide the desired nominal film thickness. The samples were then each exposed using Nikon® i-line stepper having a 0.54 Numerical Aperture (NA), soft baked at 90° C. for 60 seconds and post exposure baked at 110° C. for 60 seconds. These samples were all then developed using AZ® 300 MIF (metal ion-free) 2.38% tetramethyl ammonium hydroxide developer for 60 seconds at 23° C., using a spray development.

The imaged wafers were photographed using a high-resolution scanning electron microscope (SEM) and the critical dimensions were measured from the photos. The ideal dose to clear (DTC), in millijoules per square centimeter (mJ/cm.$^2$) and resolution in microns (micrometers) were then measured for all examples. The resulting lithographic data is set forth below.

| | Lithographic Data | | |
|---|---|---|---|
| Example No. | Film Thickness (microns) | DTC (mj/sec.) | Resolution (microns) |
| 2 | 0.975 | 42 | 0.40 |
| 3 | 0.975 | 46 | 0.36 |
| 4 | 0.975 | 42 | 0.38 |
| 5 | 0.975 | 42 | 0.38 |
| 6 | 0.975 | 42 | 0.36 |
| 7 | 0.975 | 48 | 0.36 |
| 8 | 0.975 | 50 | 0.36 |
| 9 | 0.975 | 52 | 0.34 |
| 10 | 0.975 | 50 | 0.38 |
| 11 | 0.975 | 52 | 0.34 |

| | |
|---|---|
| Dose To Print (DTP) | minimum dose (millijoules/cm.$^2$) required to replicate 1:1 the various feature sizes on the reticle. |
| Resolution | smallest feature size (microns) opened with an acceptable pattern profile (pattern edge acuity >80°). |
| Dose To Clear (DTC) | minimum dose (millijoules/cm.$^2$) required to dissolve (clear) all the resist at the exposed area upon developing, typically is fraction of the DTP. |

Dissolution Rate Measurement Procedure

Formulations:
    Dissolve 26% novolak resin solids in PGMEA. Filter through a 0.2 μm disposable Acrodisc™ filter.
Reference Standard:
    S-Resin novolak resin Stock #D9922A produced by AZ Photoresist Products, Clariant Corporation (supplied in PGMEA solvent).

Dissolution Rate Measurement Procedure:
1. Each sample was coated on a 4-inch silicon wafer, at the appropriate speed, on an SVG™ coat-development track system, then baked on a hot plate for 60 seconds at 90° C., to obtain a 1.29 μm film.
2. The film thickness was determined on an Autonanospec™ (NANOMETRICS, model 215), an automated film thickness measurement system, measuring 10 points across the entire wafer.
3. The Dissolution Rate was determined by measuring the film thickness change with time using a laser end-point detection system consists of a He-Ne laser (634 nm, 3 mW, ORIEL CORP., Model 79202) and a photodiode. The development was performed at 23° C. using AZ® 300 MIF TMAH developer and the dissolution rate was calculated by the equation:

$$\_t = \lambda/2n$$

where λ is the wavelength of the laser, n is the index of reflection of the film material at that wavelength and _t is the change in thickness that occurs in the time span between maxima (or minima) interference of the film during the dissolution process.

Having described our invention, what we desire to claim is:

1. A positive working photosensitive composition, that consists essentially of an admixture of; a) at least one film forming resin; b) at least one photosensitizer component; and 3) a photoresist solvent mixture containing more than 70 weight percent of a $C_1$–$C_4$ alkyl glycol $C_1$–$C_4$ alkyl ether and less than 30 weight percent of either a $C_1$–$C_4$ alkyl amyl ketone or a $C_1$–$C_4$ alkyl $C_1$–$C_4$ alkoxy propionate, which following coating onto silicon wafers, exposure and development, yield imaged wafers having dose to clear (DTC) values of 42 to 52 millijoules per square centimeter ($mJ/cm^2$).

2. The composition of claim 1, wherein the alkylene glycol alkyl ether is a propylene glycol methyl ether.

3. The composition of claim 1, wherein the alkyl amyl ketone is a methyl amyl ketone.

4. The composition of claim 1, wherein the alkyl alkoxy propionate is an ethyl-3-ethoxy propionate.

5. The composition of claim 1, wherein the alkylene glycol alkyl ether is present in an amount from greater than 70% to about 90% by weight of the solvent mixture, with the remainder of the solvent mixture made up of the alkyl alkoxy propionate or the alkyl amyl ketone.

6. The composition of claim 1, wherein the alkyl alkoxy propionate or the alkyl amyl ketone solvent is present in an amount from about 10% to about 30% by weight of the solvent mixture with the remainder of the solvent mixture made up of the alkylene glycol alkyl ether.

7. The composition of claim 1, wherein the film forming resin is either a novolak resin or a vinyl phenol resin and is present in an amount from about 5% to about 40% based on the weight of said composition.

8. The composition of claim 1, wherein the photosensitizer component is present in an amount from about 5% to about 35% based on the weight of the solids portion of the composition.

9. The composition of claim 1, wherein the photosensitizer component is a diazonaphthoquinone component that comprises one or more compounds selected from a diazo sulfonyl chloride reaction product with a hydroxy or polyhydroxy aryl compound, an aryl amine or a polyamine.

10. The composition of claim 1, wherein the photosensitizer component is the condensation product of a 2,3,4-trihydroxybenzophenone with a naphthoquinone-(1,2)-diazide-5-sulfonyl chloride.

11. A process for producing a positive working photosensitive composition, which process consists essentially of forming an admixture of: a) at least one film forming resin; b) at least one photosensitizer component; and c) a photoresist solvent mixture consisting essentially of more than 70 weight percent of a $C_1$–$C_4$ alky, glycol $C_1$–$C_4$ alkyl ether and less than 30 weight percent of either a $C_1$–$C_4$ alkyl $C_1$–$C_4$ alkoxy propionate or a $C_1$–$C_4$ alkyl amyl ketone, said composition which following coating onto silicon wafers, exposure and development, yield imaged wafers having dose to clear (DTC) values of 42 to 52 millijoules per square centimeter ($mJ/cm^2$).

12. The process of claim 11, wherein the alkylene glycol alkyl ether is a propylene glycol methyl ether.

13. The process of claim 11, wherein the alkyl amyl ketone is a methyl amyl ketone.

14. The process of claim 11, wherein the alkyl alkoxy propionate is an ethyl-3-ethoxy propionate.

15. The process of claim 11, wherein the alkylene glycol alkyl ether solvent is present in an amount from greater than 50% to about 90% by weight of the solvent mixture with the remainder of the solvent mixture made up of the alkyl alkoxy propionate or the alkyl amyl ketone.

16. The process of claim 11, wherein the alkylene glycol alkyl ether solvent is present in an amount from greater than 70% to about 90% by weight of the solvent mixture with the remainder of the solvent mixture made up of the alkyl alkoxy propionate or the alkyl amyl ketone.

17. The process of claim 11, wherein the film forming resin is a novolak resin or a vinyl phenol resin and is present in an amount from about 5% to about 40% based on the weight of said composition.

18. The process of claim 11, wherein the photosensitizer component is present in an amount from about 5% to about 35% based on the weight of the solids portion of the composition.

19. The process of claim 11, wherein the photosensitizer component is a diazonaphthoquinone that comprises one or more compounds selected from diazo sulfonyl chloride reaction products with a hydroxy or polyhydroxy aryl compound, an aryl amine or polyamine.

* * * * *